(12) United States Patent
Nam et al.

(10) Patent No.: US 8,772,760 B2
(45) Date of Patent: Jul. 8, 2014

(54) ORGANIC LIGHT EMITTING DIODE DEVICE AND METHOD FOR MANUFACTURING THE SAME

(75) Inventors: Kie Hyun Nam, Yongin (KR); Sang-Joon Seo, Yongin (KR); Sung-Guk An, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 106 days.

(21) Appl. No.: 12/950,100

(22) Filed: Nov. 19, 2010

(65) Prior Publication Data
US 2011/0193102 A1    Aug. 11, 2011

(30) Foreign Application Priority Data
Feb. 9, 2010   (KR) .................. 10-2010-0012073

(51) Int. Cl.
  *H01L 29/08*   (2006.01)
  *H01L 51/52*   (2006.01)

(52) U.S. Cl.
  CPC .......................... *H01L 51/5203* (2013.01)
  USPC .................. 257/40; 438/82; 438/99

(58) Field of Classification Search
  CPC .................................. H01L 51/5203
  USPC .................................................. 257/13
  See application file for complete search history.

(56) References Cited

U.S. PATENT DOCUMENTS

2005/0122043 A1*  6/2005  Kato et al. ............... 313/512
2005/0162071 A1*  7/2005  Lee et al. ................. 313/504
2007/0007524 A1*  1/2007  You et al. ................... 257/59
2007/0170455 A1*  7/2007  Choi et al. ................ 257/100
2009/0297408 A1   12/2009  Tanaka et al.

FOREIGN PATENT DOCUMENTS

| CN | 001622702 | 6/2005 |
| JP | 63083797 U | 6/1988 |
| JP | 9-204981 A | 8/1997 |
| JP | 2001-307873 | 11/2001 |
| JP | 2003217854 | 7/2003 |
| JP | 2003229059 | 8/2003 |
| JP | 2003282237 | 10/2003 |
| JP | 2004087321 | 3/2004 |
| JP | 2006236999 | 9/2006 |
| JP | 2009009923 | 1/2009 |
| KR | 10-2004-0054829 A | 6/2004 |
| KR | 1020050067364 A | 7/2005 |

(Continued)

OTHER PUBLICATIONS

Payer et al., Role of Transport Properties in Corrosion Product Growth, Materials Science and Engineering, A198, pp. 91-102, 1995.
Kuznetsova et al., Making a Superior Oxide Corrosion Passivation Layer on Aluminum Using Ozone, Langmuir, vol. 17, No. 7, pp. 2146-2152, 2001.
Abstract of Nagayama et al., The Anodic Oxidation of Iron in a Neutral Solution, Journal of The Electrochemical Society, vol. 109, Issue 9, pp. 781-790, 1962.
Abstract of Lubkowski et al., Passivation and Oxidation of an Ammonia Iron Catalyst, Applied Catalysis A: General, vol. 329, pp. 137-147, Oct. 1, 2007.
Abstract of Kulpa et al., Tarnishing of Nickel in Air at Temperatures from 23° to 200° C. and Relative Humidities from Ambient to 95%, Journal of the Electrochemical Society, vol. 124, Issue 10, pp. 1588-1592, 1977.

*Primary Examiner* — Ajay K Arora
(74) *Attorney, Agent, or Firm* — Robert E. Bushnell, Esq.

(57) ABSTRACT

An organic light emitting diode device and a manufacturing method thereof. The organic light emitting diode device includes a substrate main body, a transparent electrode formed on the substrate main body, an organic emission layer formed on the transparent electrode, a cover electrode formed on the organic emission layer and made of a metal, and a sealant formed on the substrate main body to overlap an edge of the cover electrode and cover a side surface of the organic emission layer.

19 Claims, 6 Drawing Sheets

(56) References Cited

FOREIGN PATENT DOCUMENTS

| | | |
|---|---|---|
| KR | 1020050122302 A | 12/2005 |
| KR | 10-0604685 B1 | 7/2006 |
| KR | 100640220 B1 | 11/2006 |
| KR | 100796129 B1 | 1/2008 |
| TW | I237514 | 8/2005 |
| TW | I250816 | 3/2006 |
| TW | 200731591 | 8/2007 |
| TW | 200936526 | 9/2009 |

\* cited by examiner

ORGANIC LIGHT EMITTING DIODE DEVICE AND METHOD FOR MANUFACTURING THE SAME

CLAIM OF PRIORITY

This application makes reference to, incorporates into this specification the entire contents of, and claims all benefits accruing under 35 U.S.C. §119 from an application earlier filed in the Korean Intellectual Property Office filed on Feb. 9, 2010, and there duly assigned Serial No. 10-2010-0012073.

BACKGROUND OF THE INVENTION

1. Field of the Invention

The described technology relates generally to a device. More particularly, the described technology relates generally to an organic light emitting diode device using an organic light emitting element, and a manufacturing method thereof.

2. Description of the Related Art

An organic light emitting diode device is a display device or a lighting apparatus using light emitted from an organic light emitting element. The organic light emitting diode emits light using energy generated when excitons produced by electron-hole combinations in an organic emission layer drop from an excitation state to a ground state.

SUMMARY OF THE INVENTION

It is therefore an aspect of the present invention to provide an improved organic light emitting diode device.

It is another aspect of the present invention to provide an organic light emitting diode device that prevents moisture or oxygen from penetrating into an organic emission layer.

It is still another aspect of the present invention to provide a manufacturing method for manufacturing the above-mentioned organic light emitting diode device.

According to an exemplary embodiment, an organic light emitting diode device may be constructed with a substrate main body, a transparent electrode formed on the substrate main body, an organic emission layer formed on the transparent electrode, a cover electrode formed on the organic emission layer and made of a metal, and a sealant formed on the substrate main body to overlap an edge of the cover electrode and to thereby cover a side surface of the organic emission layer.

The cover electrode may include an oxide film formed on a first surface of the cover electrode opposite to a second surface of the cover electrode facing the organic emission layer.

The cover electrode may have the thickness in a range of approximately 150 nm to approximately 5000 nm.

The cover electrode may be formed of at least one metal selected from aluminum (Al), silver (Ag), gold (Au), and magnesium (Mg).

The transparent electrode may be formed of at least one material selected from indium tin oxide (ITO), indium zinc oxide (IZO), zinc oxide (ZnO), and indium oxide ($In_2O_3$).

The sealant may be made of a frit including inorganic particles.

The inorganic particles may be formed of at least one material selected from silicon oxide ($SiO_2$), barium oxide (BaO), bismuth oxide ($Bi_2O_3$), aluminum oxide ($Al_2O_3$), titanium oxide ($TiO_2$), tantalum oxide ($Ta_2O_5$), and zinc oxide (ZnO).

The cover electrode may include a plurality of metal layers.

The plurality of metal layers of the cover electrode may be made of different metals.

An oxide film may be formed on an interface between two neighboring metal layers.

Also, according to an exemplary embodiment, a manufacturing method of an organic light emitting diode device may include providing a substrate main body, forming a transparent electrode on the substrate main body, forming an organic emission layer on the transparent electrode, forming a cover electrode including an oxide film by forming a metal layer on the organic emission layer and oxidizing a first surface of the metal layer opposite to a second surface of the metal layer facing the organic emission layer, and forming a sealant covering the side surface of the organic emission layer on the substrate main body.

The cover electrode may have a thickness of approximately 150 nm to approximately 5000 nm.

The cover electrode may be formed of at least one metal selected from aluminum (Al), silver (Ag), gold (Au), and magnesium (Mg).

The transparent electrode may be formed of at least one material selected from indium tin oxide (ITO), indium zinc oxide (IZO), zinc oxide (ZnO), and indium oxide ($In_2O_3$).

The cover electrode may be formed through sputtering.

The cover electrode may be formed through thermal deposition.

The organic emission layer may be formed through thermal deposition.

The forming of the sealant may include coating a sealing mixture including a frit, inorganic particles, an organic binder, and a solvent on the substrate main body to cover an edge of the cover electrode, drying the sealing mixture through heat to remove part of the organic binder and the solvent, firstly irradiating a laser beam to the dried sealing mixture to remove the remaining part of the organic binder and the solvent, and secondly irradiating the laser beam to harden the sealing mixture without the organic binder, thereby forming the sealant.

The inorganic particle may be formed of at least one material selected from of silicon oxide ($SiO_2$), barium oxide (BaO), bismuth oxide ($Bi_2O_3$), aluminum oxide ($Al_2O_3$), titanium oxide ($TiO_2$), tantalum oxide ($Ta_2O_5$), and zinc oxide (ZnO).

The cover electrode may include a plurality of metal layers.

The plurality of metal layers of the cover electrode may be made of different metals.

An oxide film may be formed on an interface between the plurality of metal layers.

According to the exemplary embodiments, the organic light emitting diode device has a simple structure, and the penetration of the moisture and oxygen into the organic emission layer may be suppressed.

Also, the above mentioned organic light emitting diode device may be manufactured.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

Figure 4:
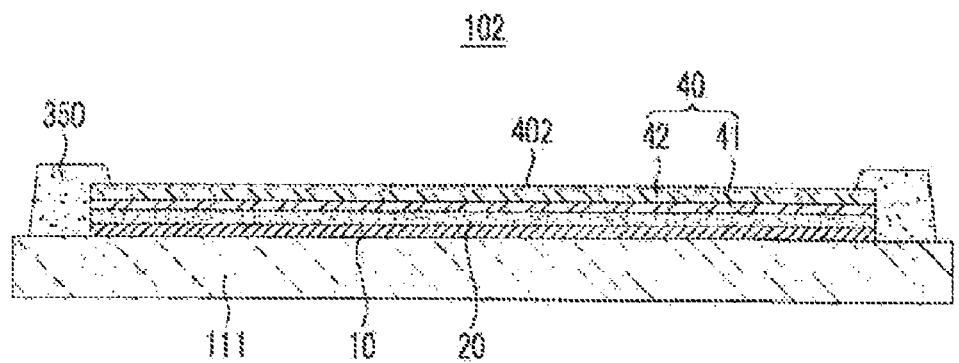
Figure 5:
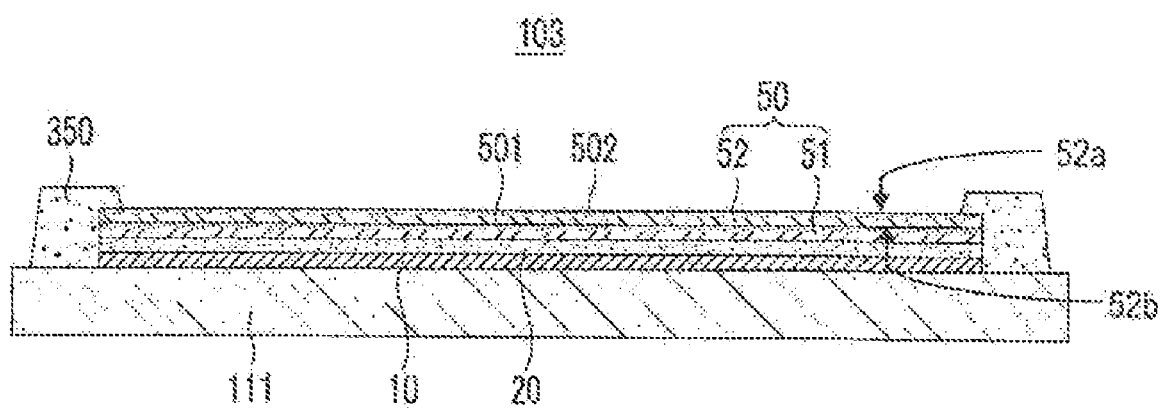
Figure 6:
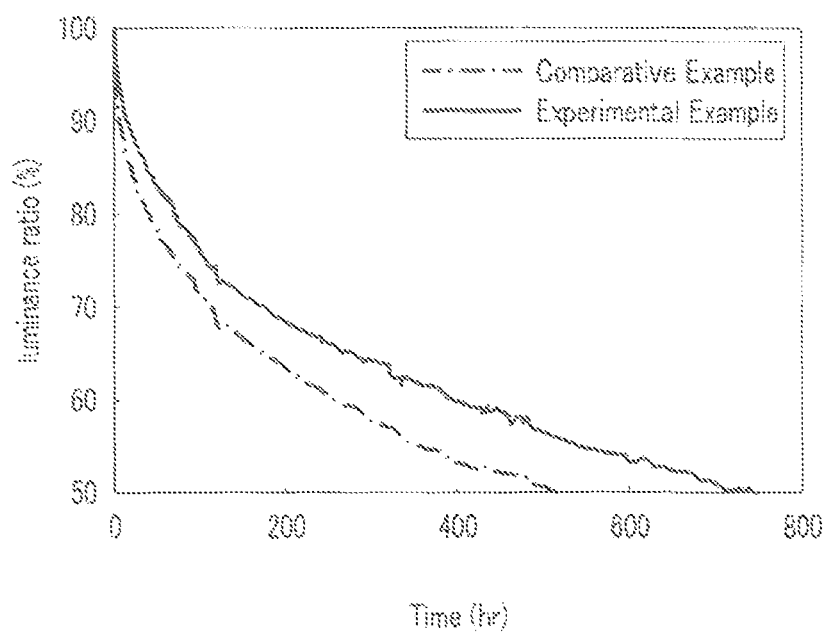
Figure 7:
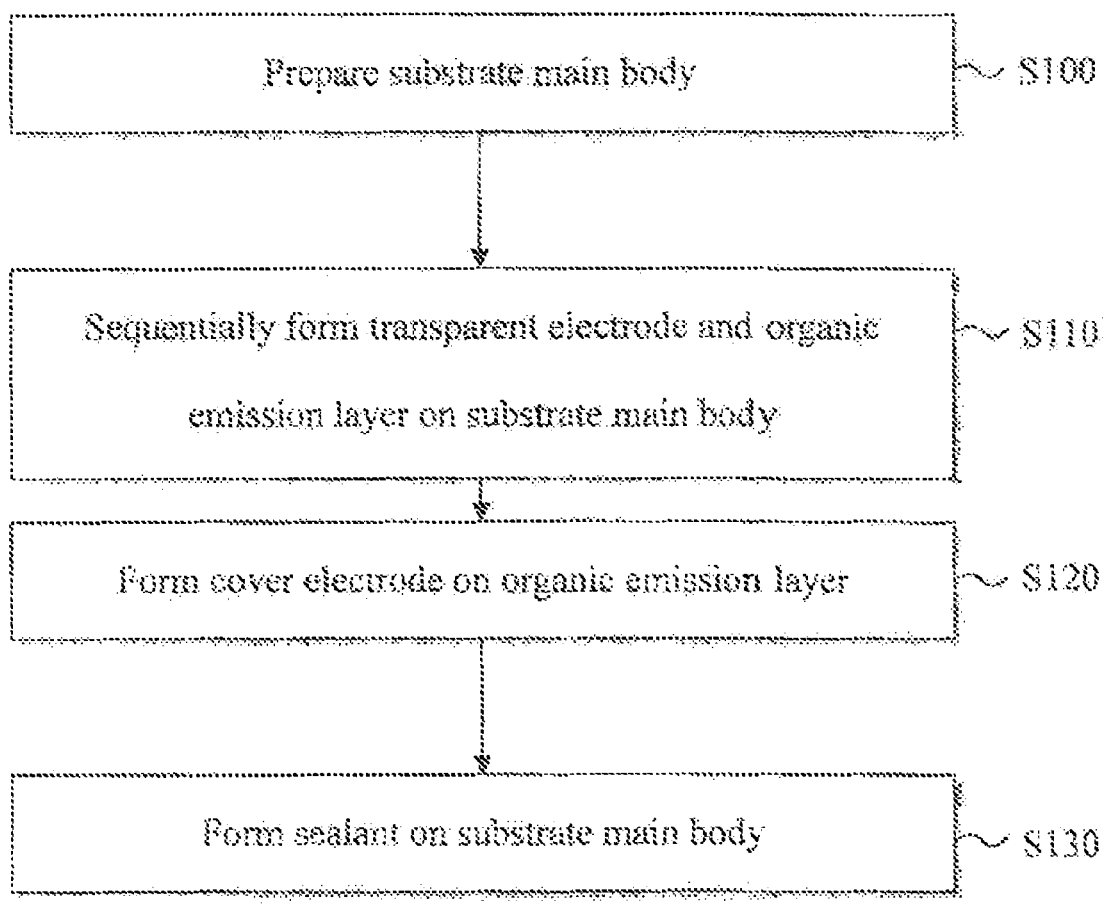
Figure 8:
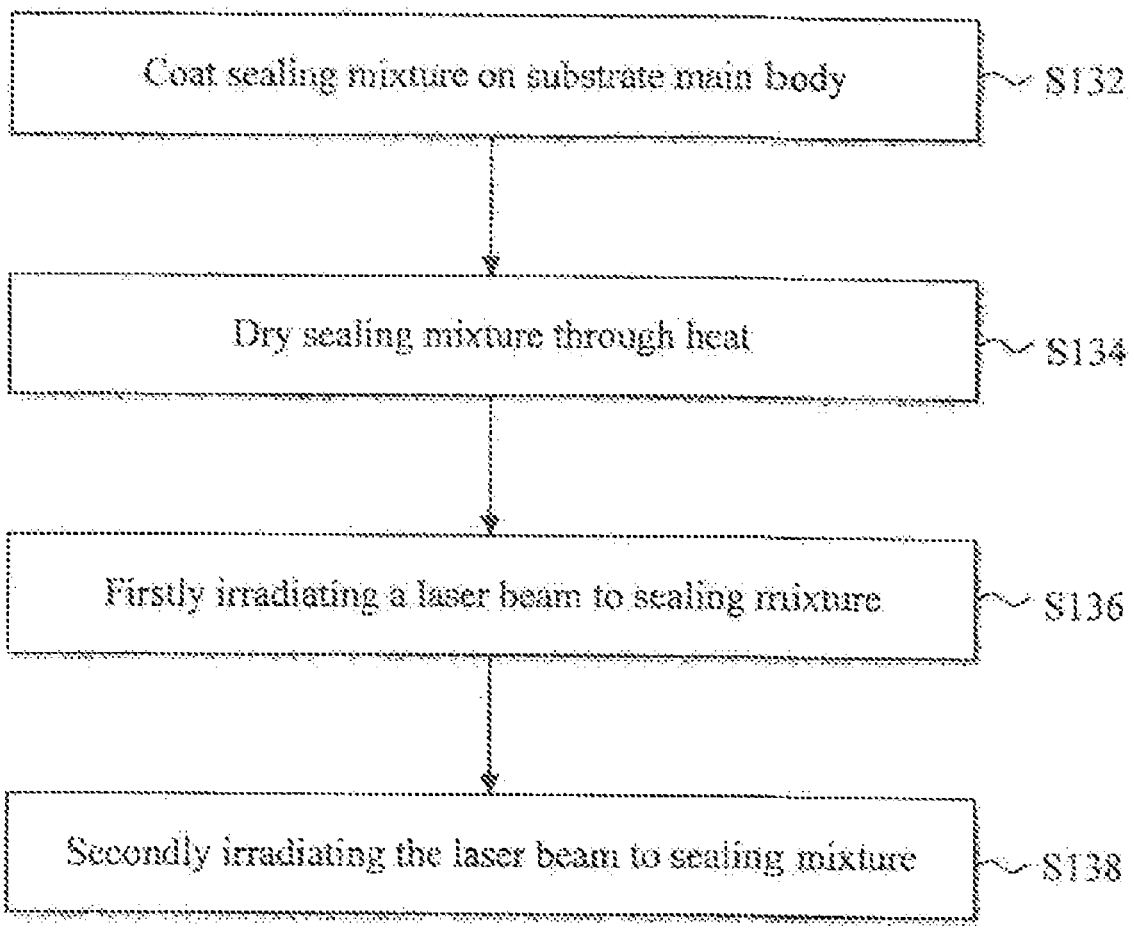

FIG. 4 is a cross-sectional view of an organic light emitting diode device constructed as a second exemplary embodiment according to the principles of the present invention;

FIG. 5 is a cross-sectional view of an organic light emitting diode device constructed as a third exemplary embodiment according to the principles of the present invention;

FIG. 6 is a graph showing an experimental result of luminance ratio as a function of usage time of an organic light emitting diode device constructed as the first exemplary embodiment and of an organic light emitting diode device constructed as a comparative example;

FIG. 7 is a flow chart illustrating a process for manufacturing an organic light emitting diode device as an exemplary embodiment according to the principles of the present invention; and FIG. 8 is a flow chart illustrating a process for forming a sealant on an organic light emitting diode device as an exemplary embodiment according to the principles of the present invention.

DETAILED DESCRIPTION OF THE INVENTION

When an organic light emitting diode device emits light, moisture or oxygen in ambient environment may undesirably penetrate into an organic emission layer formed within the organic light emitting diode device. As a result, the life-span and the quality of the organic light emitting diode device might be undesirably deteriorated.

To increase the life-span and quality of the organic light emitting diode device, the penetration of the moisture or oxygen into the organic emission layer must be suppressed. Accordingly, the organic light emitting diode device requires an additional sealing structure such as a glass can or a metal can. A sealing structure in which a groove is formed in a glass or a metal, is made of a can shape having a complicated manufacturing, process, and the overall productivity of the organic light emitting diode device may therefore be deteriorated.

Hereinafter, an exemplary embodiment will be described in detail with reference to the accompanying drawings so that those skilled in the art to which the present invention pertains can be easily carried out. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. In the exemplary embodiments subsequent to the first exemplary embodiment, configurations that are, different from the first exemplary embodiment will be described.

The sizes and thicknesses in the respective configurations shown in the drawings have arbitrary values for better understanding and ease of description, and they are not restricted in the present invention.

In the drawings, the thickness of layers, films, panels, regions, etc., are exaggerated for clarity. In the drawings, for better understanding and ease of description, thicknesses of layers and areas are exaggerated. It will be understood that when an element such as a layer, film, region, or substrate is referred to as being "on" another element, it can be directly on the other element or intervening elements may also be present.

Now, an organic light emitting diode device 101 constructed as a first exemplary embodiment according to the principles of the present invention will be described with reference to FIG. 1. Here, organic light emitting diode device 101 means an organic light emitting diode (OLED) display or an organic light emitting lighting apparatus.

Figure 1:
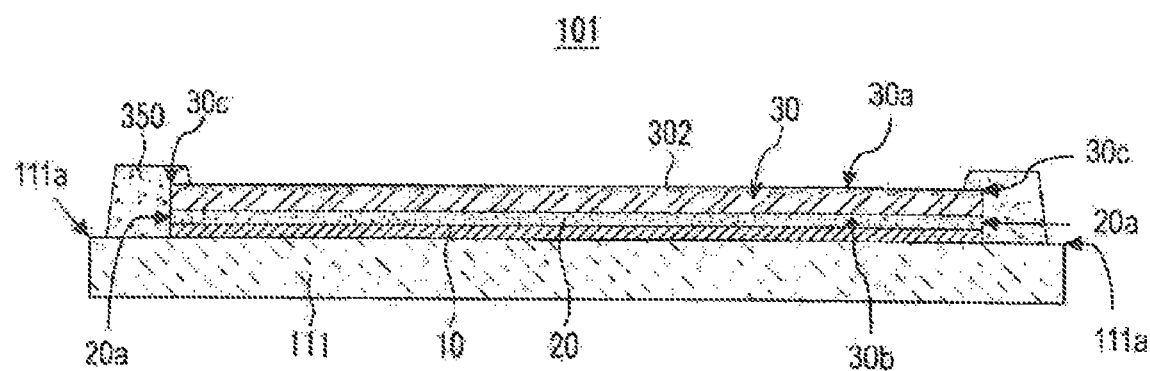
FIG. 1 is a cross-sectional view of an organic light emitting diode device constructed as a first exemplary embodiment according to the principles of the present invention.

As shown in FIG. 1, organic light emitting diode device 101 constructed as the first exemplary embodiment includes a substrate main body 111, a transparent electrode 10, an organic emission layer 20, a cover electrode 30, and a sealant 350. Here, transparent electrode 10 becomes an anode for injecting holes to organic emission layer 20. Also, cover electrode 30 becomes a cathode for injecting electrons.

Substrate main body 111 may be formed as a transparent insulating substrate made of glass, quartz, ceramic, etc., or may be formed as a transparent flexible substrate made of plastic, etc.

Transparent electrode 10 is formed on substrate main body 111. Also, transparent electrode 10 may be formed of a transparent conductive layer. The transparent conductive layer is made of a material including at least one of indium tin oxide (ITO), indium zinc oxide (IZO), zinc oxide (ZnO), and indium oxide ($In_2O_3$). The transparent conductive layer has a relatively high work function. Thus, transparent electrode 10 formed of a transparent conductive layer may perform hole injection smoothly. Moreover, to obtain relatively high resistivity of transparent electrode 10 made of the transparent conductive layer, organic light emitting diode device 101 may further include an auxiliary electrode (not shown) made of a metal having relatively low resistivity.

Also, transparent electrode 10 may further include a translucent layer (not shown) to improve the usage efficiency of the light by using a microcavity effect.

Organic emission layer 20 is formed on transparent electrode 10. Organic emission layer 10 may be formed as a multiple layer including at least one of an emission layer, a hole injection layer (HIL), a hole transport layer (HTL), an electron transport layer (ETL), and an electron injection layer (EIL). The layers except for the emission layer among the above-described layers may be omitted if necessary. In the case that organic emissive layer 20 includes all of the layers, the hole injection layer (HIL) is disposed on first electrode 710 being the anode, and is sequentially overlaid with the hole transporting layer (HTL), the emission layer, the electron transporting layer (ETL), and the electron injection layer (EIL). Furthermore, organic emission layer 20 may include other layers when needed.

As such, organic light emitting diode device 101 as the first exemplary embodiment has a bottom emission structure in which light generated from organic emission layer 20 is emitted outside through transparent electrode 10 and substrate main body 111.

Cover electrode 30 is formed on organic emission layer 20. Cover electrode 30 functions as a cathode for supplying electrons to organic emission layer 20, and functions as a sealing member for suppressing a permeation of moisture or oxygen into organic emission layer 20. Accordingly, cover electrode 30 is made of a metal including at least one of aluminum (Al), silver (Ag), gold (Au), and magnesium (Mg), to have low resistivity and an excellent characteristic for the prevention of moisture or oxygen permeation.

Also, cover electrode 30 has a thickness in the range of approximately 150 nm to approximately 5000 nm. If the thickness of cover electrode 30 is less than 150 nm, the resistivity of cover electrode 30 is increased and it is difficult for cover electrode 30 to stably prevent the permeation of moisture or oxygen. On the other hand, if cover electrode 30 is thicker than 5000 nm, the total thickness of organic light emitting diode device 101 becomes unnecessarily thick.

Also, cover electrode 30 has an oxide film 302 formed on a first surface 30a of cover electrode 30 which is opposite to a second surface 30b of cover electrode 30 facing organic emission layer 20. Oxide film 302 is relatively harder than the metal layer constituting the body of cover electrode 30. Accordingly, oxide film 302 included in cover electrode 30 may insulate cover electrode 30 from the outside and may more effectively suppress the permeation of moisture or oxygen.

Sealant 350 is formed to overlap edge 30c of cover electrode 30 on substrate main body 111. That is, sealant 350 is formed from edge 111a of substrate main body 111 to edge 30c of cover electrode 30. Accordingly, sealant 350 covers side surface 20a of organic emission layer 20. That is, sealant 350 prevents the permeation of moisture or oxygen into side surface 20a of organic emission layer 20.

Sealant 350 is made of a frit including inorganic particles. The inorganic particles include at least one of silicon oxide ($SiO_2$), barium oxide (BaO), bismuth oxide ($Bi_2O_3$), aluminum oxide ($Al_2O_3$), titanium oxide ($TiO_2$), tantalum oxide ($Ta_2O_5$), and zinc oxide (ZnO).

As described above, sealant 350 made of a material including the frit may stably suppress the permeation of moisture or oxygen. Also, the inorganic particles help the frit to be easily hardened with a laser.

Also, although not shown, organic light emitting diode device 101 may further include an insulating layer to insulate cover electrode 30 and transparent electrode 10 from each other at a predetermined position. In detail, a portion of transparent electrode 10 or a wire connected to transparent electrode 10 may extend outside a space that is closed and sealed by sealant 350 and cover electrode 30 to receive an external signal. Here, organic light emitting diode device 101 may further include an insulating layer disposed between the portion of transparent electrode 10 or the wire connected to transparent electrode 10, and cover electrode 30.

By this configuration, organic light emitting diode device 101 constructed as the first exemplary embodiment is formed with a simple structure and effectively suppresses the permeation of moisture or oxygen into organic emission layer 20.

In detail, organic light emitting diode device 101 constructed as the first exemplary embodiment may effectively suppress the permeation of moisture or oxygen into organic emission layer 20 by including cover electrode 30 having the function of cathode and sealant 350, without an additional sealing member.

Also, oxide film 302 included in cover electrode 30 not only insulates cover electrode 30 from the outside, but also suppresses the permeation of moisture or oxygen into organic emission layer 20.

Figure 2:
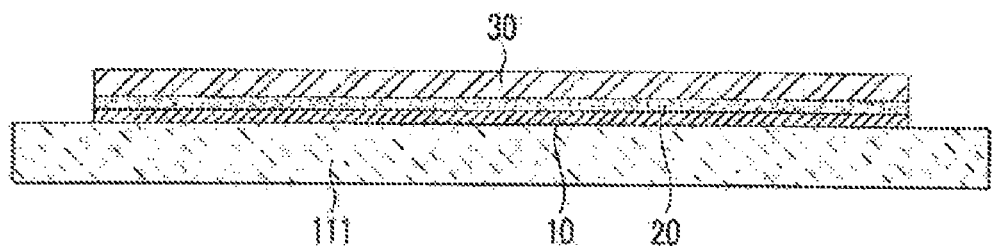
FIG. 2 and FIG. 3 are cross-sectional views sequentially showing the organic light emitting diode device of FIG. 1 during a manufacturing process o according to a manufacturing method as an embodiment according to the principles of the present invention.
Figure 3:
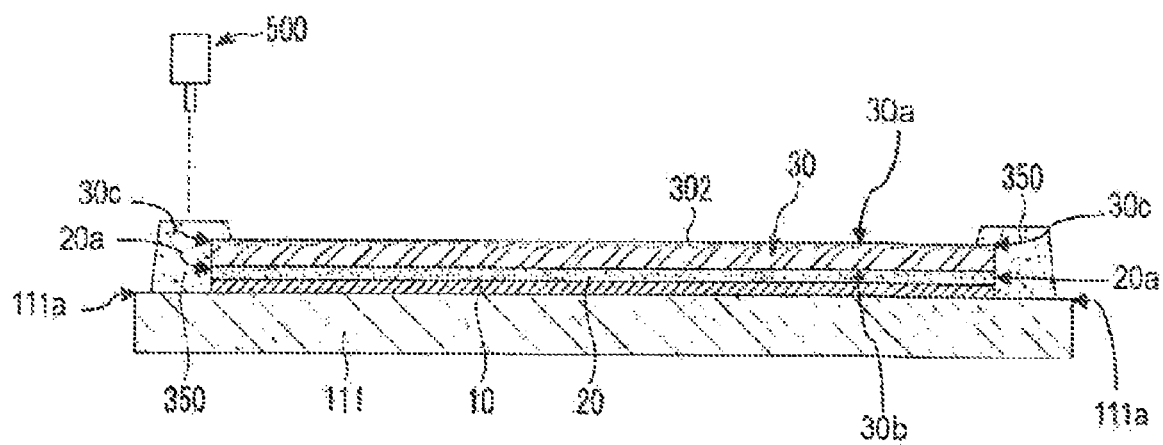

Next, a manufacturing method of an organic light emitting diode device 101 as an exemplary embodiment according to the principles of the present invention will be described with reference to FIGS. 2, 3, 7 and 8. FIG. 2 and FIG. 3 are cross-sectional views sequentially showing the organic light emitting diode device of FIG. 1 during a manufacturing process o according to a manufacturing method as an embodiment according to the principles of the present invention. FIG. 7 is a flow chart illustrating a process for manufacturing an organic light emitting diode device as an exemplary embodiment according to the principles of the present invention. FIG. 8 is a flow chart illustrating a process for forming a sealant on an organic light emitting diode device as an exemplary embodiment according to the principles of the present invention.

Firstly, as shown in FIGS. 2 and 7, a substrate main body 111 is made of a transparent insulating substrate made of glass, quartz, and ceramic, but a transparent flexible substrate made of plastic may be provided in step S100.

Next, a transparent electrode 10 and an organic emission layer 20 are sequentially formed on substrate main body 111 in step S110. Here, organic emission layer 20 is formed through a thermal evaporation method, which is a thermal deposition method. Transparent electrode 10 is made of the material including at least one of indium tin oxide (ITO), indium zinc oxide (IZO), zinc oxide (ZnO), and indium oxide ($In_2O_3$).

Next, cover electrode 30 is formed on organic emission layer 20 in step S120. Cover electrode 30 is formed by depositing a metal layer on organic emission layer 20, and forming an oxide film 302 (FIG. 3) by oxidizing first surface 30a opposite to second surface 30b of the metal layer facing organic emission layer 20. Here, the metal layer may be formed thorough sputtering or thermal deposition. The metal layer my include one of aluminum (Al), silver (Ag), gold (Au), and magnesium (Mg).

Also, cover electrode 30 has a thickness in the range of approximately 150 nm to approximately 5000 nm.

On the other hand, in the case that cover electrode 30 is formed through thermal deposition, cover electrode 30 may have relative continuity with organic emission layer 20 that is formed through the thermal deposition.

Next, as shown in FIG. 3, a sealant 350 covering side surface 20a of organic emission layer 20 is formed on substrate main body 111 in step S130.

As shown in FIG. 8, the process of forming sealant 350 is as follows. Firstly, a sealing mixture in which a frit, inorganic particles, an organic binder, and a solvent are mixed is coated on substrate main body 111, and a portion of the sealing mixture overlaps edge 30c of cover electrode 30 in step S132. That is, the sealing mixture is coated from edge 111a of substrate main body 111 to edge 30c of cover electrode 30. Next, the sealing mixture is heated and dried to remove a part of the organic binder and the solvent in step S134. Also, a laser beam 500 is firstly irradiated to the dried sealing mixture to remove the remaining part of the organic binder and the solvent in step S136. Also, to harden the sealing mixture without the organic binder and the solvent, laser beam 500 is secondly irradiated to form sealant 350 in step S138. The inorganic particle includes at least one of silicon oxide ($SiO_2$), barium oxide (BaO), bismuth oxide ($Bi_2O_3$), aluminum oxide ($Al_2O_3$), titanium oxide ($TiO_2$), tantalum oxide ($Ta_2O_5$), and zinc oxide (ZnO). When sealant 350 is irradiated with laser 500, the inorganic particles within sealant 350 absorb the laser beam, and thereby accelerating the hardening of sealant 350. As described above, sealant 350 made of the frit including the inorganic particles effectively suppresses the permeation of moisture or oxygen into the side surface of organic emission layer 20.

By the above-mentioned manufacturing method, organic light emitting diode device 101 according to the first exemplary embodiment may be effectively manufactured.

Next, an organic light emitting diode device 102 constructed as a second exemplary embodiment according to the principles of the present invention will be described with reference to FIG. 4.

As shown in FIG. 4, organic light emitting diode device 102 constructed as the second exemplary embodiment includes a cover electrode 40 including a plurality of metal layers 41 and 42. Also, among the plurality of metal layers 41 and 42, the uppermost layer, that is, metal layer 42 that is disposed farthest away from organic emission layer 20 and is exposed to the outside, includes an oxide film 402 formed on the opposite surface to the surface facing organic emission layer 20. Also, the plurality of metal layers 41 and 42 are made of different metals. Therefore, metal layers 41 and 42 may compensate drawbacks of each other. Accordingly, organic light emitting diode device 102 may effectively and stably suppress the permeation of moisture or oxygen into organic emission layer 20.

The second exemplary embodiment is not, however, limited thereto. That is, the plurality of metal layers 41 and 42 may be formed with the same metal.

By this configuration, organic light emitting diode device 102 constructed as the second exemplary embodiment has a simple structure, and the permeation of moisture or oxygen into organic emission layer 20 may be further effectively suppressed.

The manufacturing method of organic light emitting diode device 102 as the second exemplary embodiment is the same as the manufacturing method of organic light emitting diode device 101 as the first exemplary embodiment, except for the process of sequentially depositing a plurality of metal layers 41 and 42 to form cover electrode 40.

Next, an organic light emitting diode device 103 constructed as the third exemplary embodiment according to the principles of the present invention will be described with reference to FIG. 5.

As shown in FIG. 5, organic light emitting diode device 103 constructed as the third exemplary embodiment includes a cover electrode 50 including a plurality of metal layers 51 and 52, and an oxide film 501 is formed on the interface between metal layers 51 and 52. Also, among the plurality of metal layers 51 and 52, the uppermost layer, that is, metal layer 52 that is disposed farthest away from organic emission layer 20 and is exposed to the outside, includes an oxide film 502 formed on first surface 52a opposite to second surface 52b of metal layer 52 facing organic emission layer 20. Oxide films 501 and 502 are relatively solid compared with metal layers 51 and 52.

As described above, organic light emitting diode device 103 according to the third exemplary embodiment includes cover electrode 50 having the plurality of oxide films 501 and 502 such that the permeation of moisture or oxygen into organic emission layer 20 may be effectively suppressed.

The manufacturing method of organic light emitting diode device 103 as the third exemplary embodiment is the same as the manufacturing method of organic light emitting diode device 101 as the first exemplary embodiment, except for the process of sequentially forming the plurality of metal layers 51 and 52 and oxide films 501 and 502 to form cover electrode 40.

Next, an organic light emitting diode device constructed as an experimental example according to the first exemplary embodiment and an organic light emitting diode device constructed as a comparative example will be described with reference to FIG. 6. The experimental example has cover electrode 30 of FIG. 1 as the first exemplary embodiment. In detail, cover electrode 30 of the experimental example has a thickness of 300 nm. In contrast, the comparative example includes a cover electrode 30 having a thickness of 100 nm.

FIG. 6 shows deterioration of the luminance ratio as a function of usage time of the organic light emitting diode device constructed as the first exemplary embodiment and of the organic light emitting diode device constructed as a comparative example.

As shown in FIG. 6, in the case of the experimental example, the luminance ratio is more than 50% after usage time of more than 700 hours. In contrast, in the case of the comparative example, the luminance ratio is deteriorated to less than 50% after usage time of about 500 hours. This is because moisture or oxygen is permeated into organic emission layer 20 such that the durability of organic emission layer 20 is deteriorated.

Accordingly, through the present experimental, if cover electrode 30 as the cathode has the thickness of more than 150 nm, it may be confirmed that cover electrode 30 may maintain the luminance ratio at more than a predetermined degree during the appropriate usage time without a separate sealing member.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF REFERENCE NUMERALS

| | |
|---|---|
| 101: organic light emitting diode device | 10: transparent electrode |
| 20: organic emission layer | 30: cover electrode |
| 111: substrate main body | 302: oxide film |
| 350: sealant | |

What is claimed is:

1. An organic light emitting diode device, comprising:
a substrate main body;
a transparent electrode formed on the substrate main body;
an organic emission layer formed on the transparent electrode;
a cover electrode formed on the organic emission layer and made of a metal, the cover electrode including an oxide film formed on a first surface of the cover electrode opposite to a second surface of the cover electrode facing the organic emission layer, the oxide film being formed by oxidation of the metal of the first surface, the cover electrode having a thickness in a range of approximately 150 nm to approximately 5000 nm, the oxide film being thin in comparison with the metal of the cover electrode; and
a sealant formed on the substrate main body to overlap an edge of the cover electrode and cover a side surface of the organic emission layer,
the cover electrode and the sealant effectively suppressing the permeation of moisture or oxygen into the organic emission layer.

2. An organic light emitting diode device, comprising:
a substrate main body;
a transparent electrode formed on the substrate main body;
an organic emission layer formed on the transparent electrode;
a cover electrode formed on the organic emission layer and being formed of at least one metal selected from aluminum (Al), silver (Ag), gold (Au), and magnesium (Mg), the cover electrode including an oxide film formed on a first surface of the cover electrode opposite to a second surface of the cover electrode facing the organic emission layer, the oxide film being formed by oxidation of the metal of the first surface, the cover electrode having a thickness in a range of approximately 150 nm to approximately 5000 nm, the oxide film being thin in comparison with the metal of the cover electrode; and a sealant formed on the substrate main body to overlap an edge of the cover electrode and cover a side surface of the organic emission layer, the cover electrode and the sealant effectively suppressing the permeation of moisture or oxygen into the organic emission layer.

3. The organic light emitting diode device of claim 1, the transparent electrode being formed of at least one material selected from indium tin oxide (ITO), indium zinc oxide (IZO), zinc oxide (ZnO), and indium oxide ($In_2O_3$).

4. The organic light emitting diode device of claim 1, the sealant being made of a frit including inorganic particles.

5. The organic light emitting diode device of claim 4, the inorganic particle being formed of at least one material selected from silicon oxide ($SiO_2$), barium oxide (BaO), bismuth oxide ($Bi_2O_3$), aluminum oxide ($Al_2O_3$), titanium oxide ($TiO_2$), tantalum oxide ($Ta_2O_5$), and zinc oxide (ZnO).

6. The organic light emitting diode device of claim 1, the cover electrode including a plurality of metal layers.

7. The organic light emitting diode device of claim 6, the plurality of metal layers of the cover electrode being made of different metals.

8. The organic light emitting diode device of claim 6, an oxide film being formed on an interface between two neighboring metal layers by oxidation of a metal layer surface.

9. A method for manufacturing an organic light emitting diode device, comprising:
  providing a substrate main body;
  forming a transparent electrode on the substrate main body;
  forming an organic emission layer on the transparent electrode;
  forming a cover electrode including an oxide film by forming a metal layer on the organic emission layer and oxidizing a first surface of the metal layer opposite to a second surface of the metal layer facing the organic emission layer, the cover electrode having a thickness in a range of approximately 150 nm to approximately 5000 nm, the oxide film being thin in comparison with the metal of the cover electrode; and
  forming a sealant covering a side surface of the organic emission layer on the substrate main body,
  the cover electrode and the sealant effectively suppressing the permeation of moisture or oxygen into the organic emission layer.

10. The method of claim 9, the cover electrode being formed of at least one metal selected from aluminum (Al), silver (Ag), gold (Au), and magnesium (Mg).

11. The method of claim 9, the transparent electrode being formed of at least one material selected from indium tin oxide (ITO), indium zinc oxide (IZO), zinc oxide (ZnO), and indium oxide ($In_2O_3$).

12. The method of claim 9, the cover electrode being formed through sputtering.

13. The method of claim 9, the cover electrode being formed through thermal deposition.

14. The method of claim 13, the organic emission layer being formed through thermal deposition.

15. The method of claim 9, the forming of the sealant including:
  coating a sealing mixture including a frit, inorganic particles, an organic binder, and a solvent on the substrate main body to cover an edge of the cover electrode;
  drying the sealing mixture through heat to remove part of the organic binder and the solvent;
  firstly irradiating a laser beam to the dried sealing mixture to remove the remaining part of the organic binder and the solvent; and
  secondly irradiating the laser beam to harden the sealing mixture without the organic binder, thereby forming the sealant.

16. The method of claim 15, the inorganic particle being formed of at least one material selected from silicon oxide ($SiO_2$), barium oxide (BaO), bismuth oxide ($Bi_2O_3$), aluminum oxide ($Al_2O_3$), titanium oxide ($TiO_2$), tantalum oxide ($Ta_2O_5$), and zinc oxide (ZnO).

17. The method of claim 9, the cover electrode including a plurality of metal layers.

18. The method of claim 17, the plurality of metal layers of the cover electrode being made of different metals.

19. The method of claim 17, an oxide film being formed on an interface between two neighboring metal layers by oxidation of a metal layer surface.

* * * * *